(12) United States Patent
Yin et al.

(10) Patent No.: US 11,067,459 B1
(45) Date of Patent: Jul. 20, 2021

(54) STRESS SENSOR STRUCTURE AND A MANUFACTURING METHOD THEREOF

(71) Applicant: National Center for Advanced Packaging Co., LTD, Wuxi (CN)

(72) Inventors: Wen Yin, Wuxi (CN); Heng Yang, Wuxi (CN); Chuanguo Dou, Wuxi (CN); Wenqi Zhang, Wuxi (CN); Tingyu Lin, Wuxi (CN); Liqiang Cao, Wuxi (CN)

(73) Assignee: NATIONAL CENTER FOR ADVANCED PACKAGE, Wuxi (CN)

( * ) Notice: Subject to any disclaimer, the term of this patent is extended or adjusted under 35 U.S.C. 154(b) by 470 days.

(21) Appl. No.: 16/304,730

(22) PCT Filed: Nov. 24, 2017

(86) PCT No.: PCT/CN2017/112857
§ 371 (c)(1),
(2) Date: Nov. 27, 2018

(87) PCT Pub. No.: WO2019/024340
PCT Pub. Date: Feb. 7, 2019

(30) Foreign Application Priority Data

Aug. 3, 2017 (CN) .......................... 201710659009.7

(51) Int. Cl.
*G01L 1/00* (2006.01)
*G01L 1/18* (2006.01)
(Continued)

(52) U.S. Cl.
CPC ............ *G01L 1/18* (2013.01); *H01L 41/0471* (2013.01); *H01L 41/1132* (2013.01)

(58) Field of Classification Search
CPC ..... G01L 1/18; H01L 41/0471; H01L 41/1132
See application file for complete search history.

(56) References Cited

U.S. PATENT DOCUMENTS 5,371,527 A * 12/1994 Miller ................. B41J 2/14008
347/46
9,003,620 B2 * 4/2015 Wang .................... B41J 2/1646
29/25.35
(Continued)

FOREIGN PATENT DOCUMENTS

| CN | 104724662 A | 6/2015 |
| CN | 104819789 A | 8/2015 |
| CN | 106935526 A | 7/2017 |

OTHER PUBLICATIONS

Chinese Office Action issued in corresponding Chinese Patent Application No. 201710659009.7 dated Apr. 23, 2019, pp. 1-6 (including English translation).
(Continued)

*Primary Examiner* — Max H Noori
(74) *Attorney, Agent, or Firm* — MH2 Technology Law Group LLP

(57) ABSTRACT

The present invention discloses a stress sensor structure and a manufacturing method thereof, wherein the stress sensor structure comprises: a substrate; a blind-hole, provided on a first surface of the substrate; a first piezoresistive layer and a second piezoresistive layer, formed by material with piezoresistive effect, provided on a lateral wall of the blind-hole and interconnected at bottom portions of the layers; a second insulating layer, provided between the first piezoresistive layer and the second piezoresistive layer; a first electrode, provided on the first surface of the substrate and connected to the first piezoresistive layer; a second electrode, provided on the first surface of the substrate and connected to the second piezoresistive layer. The resistance measured by applying an external voltage between the first electrode and the second electrode can be used to indicator a stress of the TSV structure, in particular an axial stress
(Continued)

thereof, so that the stress sensor can be used to measure a stress of the TSV structure.

10 Claims, 9 Drawing Sheets

(51) Int. Cl.
*H01L 41/113* (2006.01)
*H01L 41/047* (2006.01)

(56) References Cited

U.S. PATENT DOCUMENTS

| | | | |
|---|---|---|---|
| 2010/0102678 A1* | 4/2010 | Saita | H03H 9/1035 |
| | | | 310/344 |
| 2012/0133049 A1 | 5/2012 | Lin et al. | |
| 2013/0038174 A1* | 2/2013 | Kim | H01L 41/1132 |
| | | | 310/327 |

OTHER PUBLICATIONS

Xiaofeng Wang (Authorized Officer), International Search Report dated May 14, 2018, PCT Application No. PCT/CN2017/112857, pp. 1-6 (including English translation).

\* cited by examiner

STRESS SENSOR STRUCTURE AND A MANUFACTURING METHOD THEREOF

TECHNICAL FIELD

The present invention pertains to the technical field of semiconductors, and in particular relates to a stress sensor structure and a manufacturing method thereof.

BACKGROUND

Through Silicon Via (TSV) technology is an advanced packaging technology for realizing vertical interconnection between layers of a chip. By means of vertical interconnection, the distance of information communication can be shortened, the working frequency of the chip can be increased, the power consumption of the chip can be reduced, and the package integration level of the chip can be increased. TSV structures have already been widely used in aspects such as imaging sensors, high-speed logic storage chips, multi-core processors, and so on.

A typical TSV structure interconnects layers of a chip by a conductive metal column (e.g. a copper column) passing through a substrate (e.g. silicon wafer). In one aspect, there is a relatively large difference between the thermal expansion coefficients of the conductive metal and the substrate; in anther aspect, as influenced by the manufacturing process of the TSV structure, the TSV structure would have a relatively large thermal stress. The relatively large thermal stress would significantly influence the performance of an integrated circuit chip, for example, the charge carrier mobility along some crystalline orientations of a monocrystalline silicon is a function of the stress; the relatively large thermal stress would also have serious influence on the reliability of the TSV structure. Therefore, measuring the stress of a TSV structure and studying the influence of the manufacturing technique of a TSV structure on its thermal stress is an important method for increasing the performance and reliability of an integrated circuit chip.

Chinese patent literature (CN104724662A) discloses a polycrystalline silicon stress sensor and a manufacturing method thereof. The method first forms a silicon bore structure having a first depth in the surface of a silicon substrate; forms a first blocking layer on the surface of the silicon substrate and the surface of the silicon bore structure, and then removes a part of the first blocking layer at the bottom of the silicon bore structure and etches the silicon bore structure to a second depth; and forms a polycrystalline silicon layer on the surface of the first blocking layer and on the lower side wall and bottom of the silicon bore structure. The stress sensor manufactured by this method utilizes the silicon substrate as an electrode of a force-sensitive resistance and measures the stress of the TSV structure by measuring the variation of the resistance between the silicon substrate and the polycrystalline silicon layer. However, the measurement accuracy of this stress sensor is largely influenced by the silicon substrate, and the substrate must adopt a heavy-doped silicon wafer of the same doping type as the polycrystalline silicon layer to get a relatively accurate measurement result. It can thus be seen that, it is difficult for the stress sensor manufactured by this method to realize stress measuring of a TSV structure manufactured with a common silicon substrate.

Chinese patent literature (CN106935526A) discloses a polycrystalline silicon stress sensor structure for silicon bore interconnection and a manufacturing method thereof. This method first forms an annular deep groove in the silicon wafer substrate; and then fills the deep groove with polycrystalline silicon twice to form a polycrystalline silicon stress sensor, thereby avoiding using a silicon substrate as an electrode of the stress sensor, increasing the measurement accuracy of the stress sensor and relieving the restrictions on the doping type and concentration of the silicon wafer, so that axial stress measuring of a TSV structure manufactured with a common silicon wafer can be realized. However, this method has high technical requirements for using polycrystalline silicon to fill the annular deep groove, and filling without pores is usually difficult to realize, which causes uneven distribution of polycrystalline silicon in the stress sensor manufactured by this method and therefore significantly influences the measurement accuracy of the stress sensor. Besides, because a polycrystalline silicon layer with such pores is in close proximity to the conductive metal column of the TSV structure, it is very difficult to detect these pores by a non-destructive detecting method.

The present patent application proposes a novel structure of side-wall double-layered polycrystalline silicon sensor and a novel processing method thereof, which can manufacture a polycrystalline silicon stress sensor that is insulated from the silicon substrate and without pores on a side wall of TSV.

SUMMARY OF THE INVENTION

In view of the above, the embodiments of the present invention provide a stress sensor structure and a manufacturing method thereof, in order to overcome the defects of low measurement accuracy of stress sensors in prior art.

A first aspect of the present invention provides a stress sensor structure that comprises: a substrate; a blind-hole, provided on a first surface of the substrate; a first piezoresistive layer and a second piezoresistive layer, formed by material with piezoresistive effect, provided on a lateral wall of the blind-hole and interconnected at bottom portions of the layers; a second insulating layer, provided between the first piezoresistive layer and the second piezoresistive layer; a first electrode, provided on the first surface of the substrate and connected to the first piezoresistive layer; a second electrode, provided on the first surface of the substrate and connected to the second piezoresistive layer.

Optionally, the stress sensor structure further comprises a first insulating layer between the first piezoresistive layer and the substrate.

Optionally, a third insulating layer is provided on one side of the second piezoresistive layer facing the blind-hole.

Optionally, the blind-hole is filled with electrical-conductive metal.

A second aspect of the present invention provides a manufacturing method of a stress sensor structure that comprises: forming a blind-hole on a first surface of a substrate; forming a first piezoresistive layer on a lateral wall of the blind-hole; forming a second insulating layer on a surface of the first piezoresistive layer, with a bottom portion of the second insulating layer higher than a bottom portion of the first piezoresistive layer; forming a second piezoresistive layer on the lateral wall of the blind-hole, the second piezoresistive layer being connected to a bottom portion of the first piezoresistive layer; providing a first electrode connected to the first piezoresistive layer on the first surface of the substrate, and providing a second electrode connected to the second piezoresistive layer on the first surface of the substrate.

Optionally, the steps of forming a first piezoresistive layer on a lateral wall of the blind-hole and forming a second insulating layer on a surface of the first piezoresistive layer with a bottom portion of the second insulating layer higher than a bottom portion of the first piezoresistive layer comprise: forming the first piezoresistive layer on the lateral wall and bottom of the blind-hole; forming the second insulating layer on the lateral wall and bottom of the blind-hole; removing a first predefined area of the first piezoresistive layer and the second insulating layer at the bottom of the blind-hole, the first predefined area being smaller than or equal to an opening area of the blind-hole.

Optionally, the step of forming a second piezoresistive layer on the lateral wall of the blind-hole with the second piezoresistive layer being connected to a bottom portion of the first piezoresistive layer comprises: forming the second piezoresistive layer on the lateral wall and bottom of the blind-hole; removing a second predefined area of the second piezoresistive layer at the bottom of the blind-hole, the second predefined area being smaller than or equal to an opening area of the blind-hole, and the second predefined area being smaller than the first predefined area.

Optionally, after the step of forming a blind-hole on a first surface of a substrate, before the step of forming a first piezoresistive layer on a lateral wall of the blind-hole, the method also comprises: forming a first insulating layer on the lateral wall and bottom of the blind-hole.

Optionally, after the step of forming a second piezoresistive layer on the lateral wall of the blind-hole, the method also comprises: forming a third insulating layer is provided on a surface of the second piezoresistive layer.

Optionally, after the step of forming a third insulating layer is provided on a surface of the second piezoresistive layer, the method also comprises: filling electrical-conductive metal into the blind-hole.

In the stress sensor structure provided by the embodiments of the present invention, the first piezoresistive layer and the second piezoresistive layer are separated by the second insulating layer and are only interconnected at bottom portions thereof, so that, when an external voltage is applied between the first electrode and the second electrode, electrical current flows through the first electrode, the first piezoresistive layer, the second piezoresistive layer and the second electrode in sequence, and because the first and second piezoresistive layers have piezoresistive effect, therefore, the resistance measured by applying an external voltage between the first electrode and the second electrode can be used to indicator a stress of the TSV structure, in particular an axial stress thereof, so that the stress sensor can be used to measure a stress of the TSV structure.

BRIEF DESCRIPTION OF THE DRAWINGS

By referring to the appended drawings, the characteristics and advantages of the present invention would be more clearly understood. The appended drawings are only illustrative and should not be interpreted as any limitation to the present invention. In the appended drawings.

DETAILED DESCRIPTION OF EMBODIMENTS

In order to make the purposes, advantages and manufacturing methods of the present invention clearer, hereinafter exemplary embodiments of the present invention will be described in detail in conjunction with the appended drawings, examples of the embodiments are shown in the appended drawings, wherein preferable structural materials are directly given for some structures in the appended drawings, apparently, the described embodiments are part of, but not all of, the embodiments of the present invention. It should be noted that, the embodiments described with reference to the appended drawings are only exemplary, and the structural materials indicated in the embodiments are also exemplary, just for explaining the present invention and not to be interpreted as limitation to the present invention, and the appended drawings of the respective embodiments of the present invention are only for the purpose of illustration and are therefore not necessarily be drawn to scale. Based on the embodiments in the present invention, all the other embodiments obtained by a person skilled in the art on the premise of not making any creative labor all belong to the protection scope of the present invention.

Embodiment 1

Figure 8:
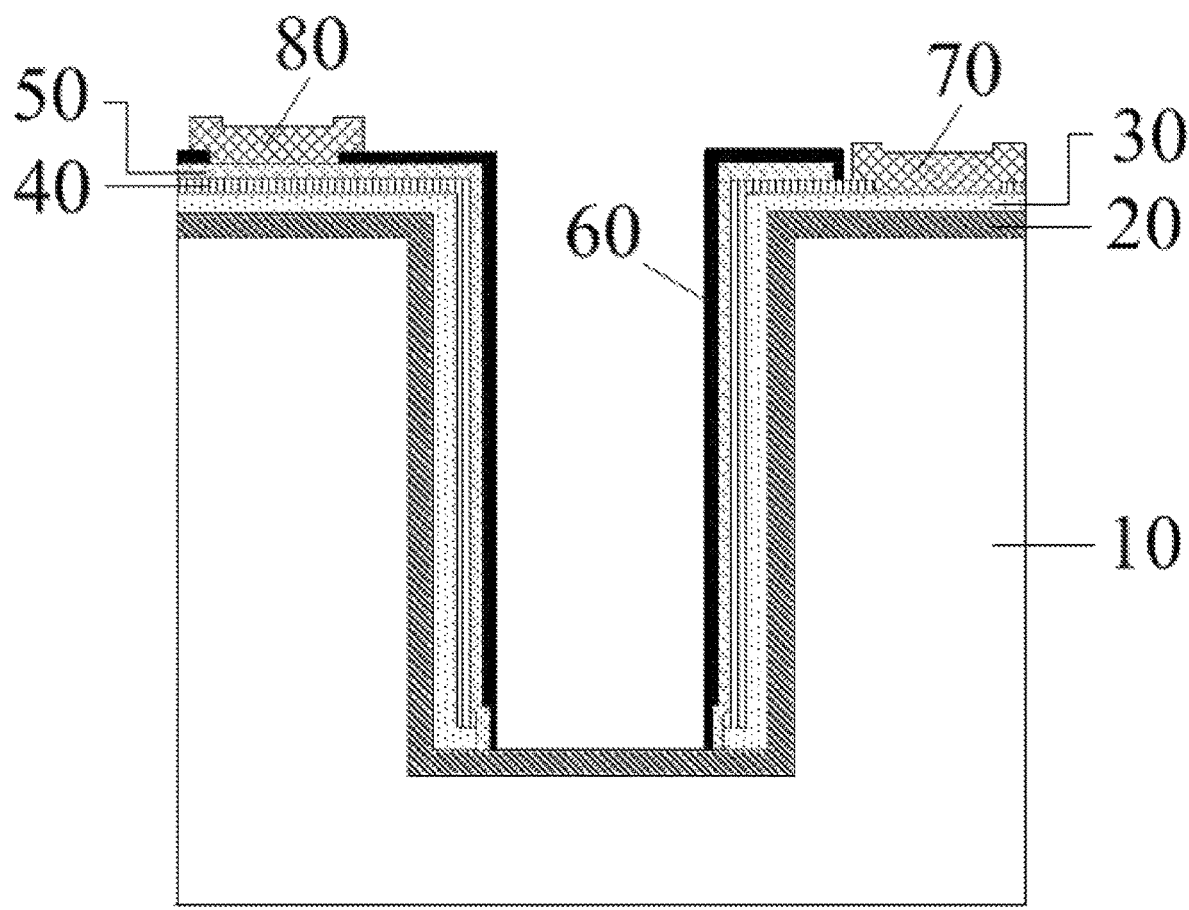
FIG. 8 shows a schematic diagram after forming a third insulating layer on a surface of the second piezoresistive layer and providing a first electrode and a second electrode.

The embodiments of the present invention provide a stress sensor structure. As shown in FIG. 8, the stress sensor structure comprises a substrate 10 and a blind-hole provided on a first surface of the substrate.

A first piezoresistive layer 30 and a second piezoresistive layer 50 are provided on a lateral wall of the blind-hole and interconnected at bottom portions of these layers. A second insulating layer 40 is provided between the first piezoresistive layer 30 and the second piezoresistive layer 50. The first piezoresistive layer 30 and the second piezoresistive layer 50 are formed by material with piezoresistive effect.

Optionally, the first piezoresistive layer 30 and the second piezoresistive layer 50 are polycrystalline silicon. A piezoresistive layer formed by polycrystalline silicon is relatively uniform, which makes the measurement accuracy of a polycrystalline silicon stress sensor superior than that of stress sensors produced by other materials. Besides, polycrystalline silicon can endure relatively high temperature, and is thus not influenced by the electrical-conductive metal temperature when electrical-conductive metal is being filled in the blind-hole to form an electrical-conductive column, so that any measurement error of the stress sensor caused by this can be avoided.

A first electrode 70 is provided on the first surface of the substrate and connected to the first piezoresistive layer 30. A second electrode 80 is also provided on the first surface of the substrate and connected to the second piezoresistive layer 50.

Optionally, a first insulating layer 20 is also included between the first piezoresistive layer 30 and the substrate 10, for preventing any influence of the substrate 10 (for example, when the substrate 10 is a silicon substrate) on the measurement accuracy of the stress sensor.

Optionally, a third insulating layer 60 is also provided on one side of the second piezoresistive layer 50 facing the blind-hole, for insulating the second piezoresistive layer 50 from the electrical-conductive metal that is to be filled in the blind-hole.

As an alternative of this embodiment, the blind-hole is filled with electrical-conductive metal, such as copper.

Further, the second surface (opposite to the first surface) of the substrate 10 may be thinned until the filled electrical-conductive metal emerges, so that a TSV through-hole structure is formed.

When using the above-mentioned stress sensor to measure a stress of a certain structure (for example, a blind-hole filled with electrical-conductive metal) or a stress caused by a certain step (for example, annealing), a first resistance is measured by applying a voltage between the first electrode and the second electrode before the certain structure is formed or before the certain step is performed; then, the certain structure is formed or the certain step is performed, and a second resistance is measured in the same way (by applying a voltage between the first electrode and the second electrode). The stress caused by the certain structure or the certain step can be determined according to the difference between the first electrode and the second electrode.

Optionally, the Weston bridge method can be used to measure the resistance between the first electrode and the second electrode.

In the above-mentioned stress sensor structure, the first piezoresistive layer and the second piezoresistive layer are separated by the second insulating layer and are only interconnected at bottom portions thereof, so that, when an external voltage is applied between the first electrode and the second electrode, electrical current flows through the first electrode, the first piezoresistive layer, the second piezoresistive layer and the second electrode in sequence, and because the first and second piezoresistive layers have piezoresistive effect, therefore, the resistance measured by applying an external voltage between the first electrode and the second electrode can be used to indicator a stress of the TSV structure, in particular an axial stress thereof, so that the stress sensor can be used to measure a stress of the TSV structure.

Embodiment 2

The embodiments of the present invention provide a manufacturing method of a stress sensor structure, for manufacturing the stress sensor structure described in Embodiment One. The method comprises the following steps:

Step S101: forming a blind-hole on a first surface of a substrate.

Step S102: forming a first piezoresistive layer on a lateral wall of the blind-hole.

Figure 2:
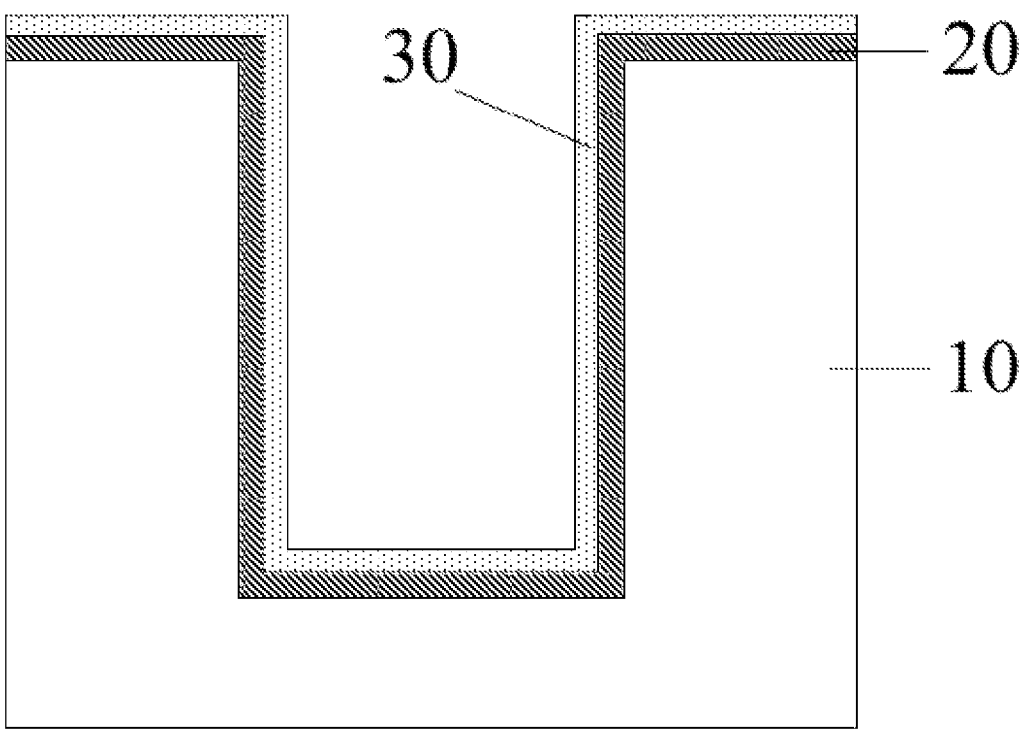
FIG. 2 shows a schematic diagram of forming a first piezoresistive layer on a lateral wall of the blind-hole.

Referring to FIG. 2, the substrate 10 and the first piezoresistive layer 30 are shown. When there is a relatively good insulating effect between the substrate 10 and the first piezoresistive layer 30, the first piezoresistive layer 30 may be directly formed on the substrate surface; when the substrate 10 is a silicon substrate, in order to let the stress sensor be not influenced by the substrate, an insulating layer may be provided between the first piezoresistive layer 30 and the surface of the substrate 10.

Step S103: forming a second insulating layer on a surface of the first piezoresistive layer, with a bottom portion of the second insulating layer higher than a bottom portion of the first piezoresistive layer.

Figure 3:
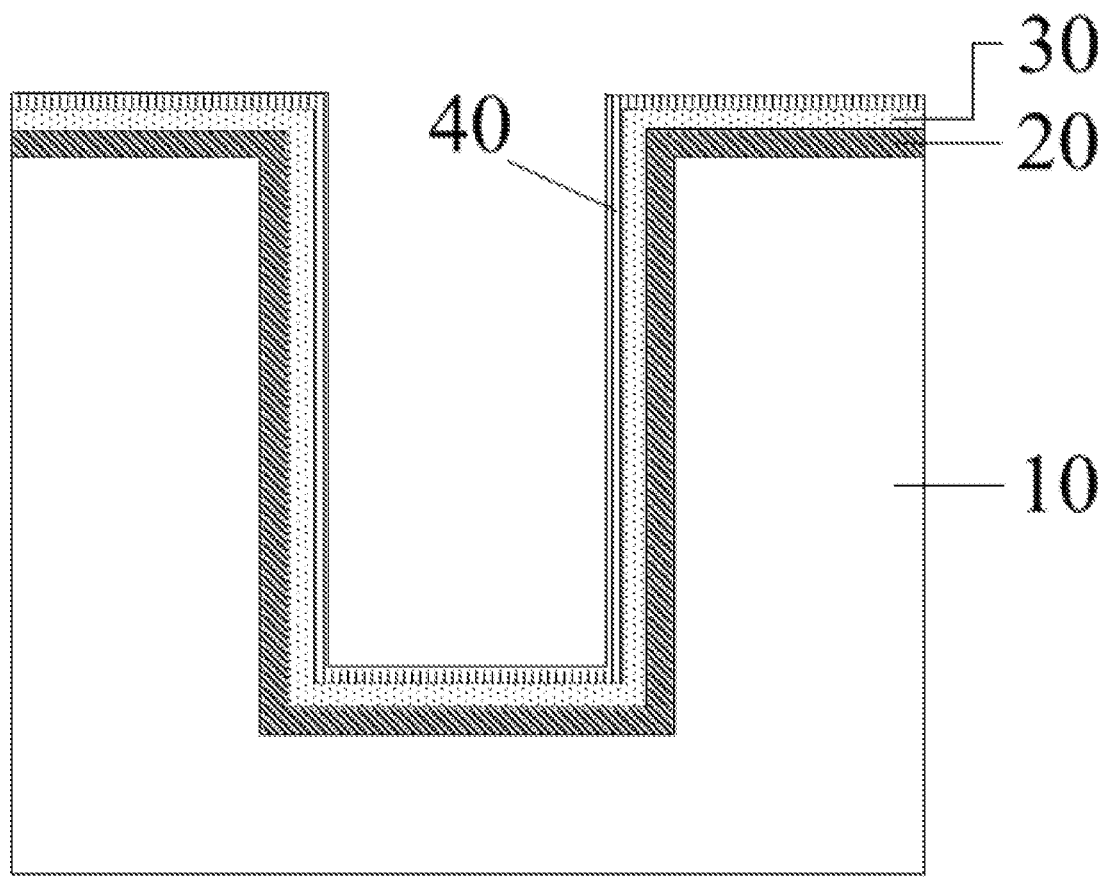
FIG. 3 shows a schematic diagram of forming a second insulating layer on a surface of the first piezoresistive layer.

Referring to FIG. 3, the second insulating layer 40 is shown. The portion of the second insulating layer 40 at the bottom of the blind-hole is higher than the portion of the first piezoresistive layer 30 at the bottom of the blind-hole, so as to allow the first piezoresistive layer 30 to emerge.

Step S104: forming a second piezoresistive layer on the lateral wall of the blind-hole, the second piezoresistive layer being connected to a bottom portion of the first piezoresistive layer.

Figure 7:
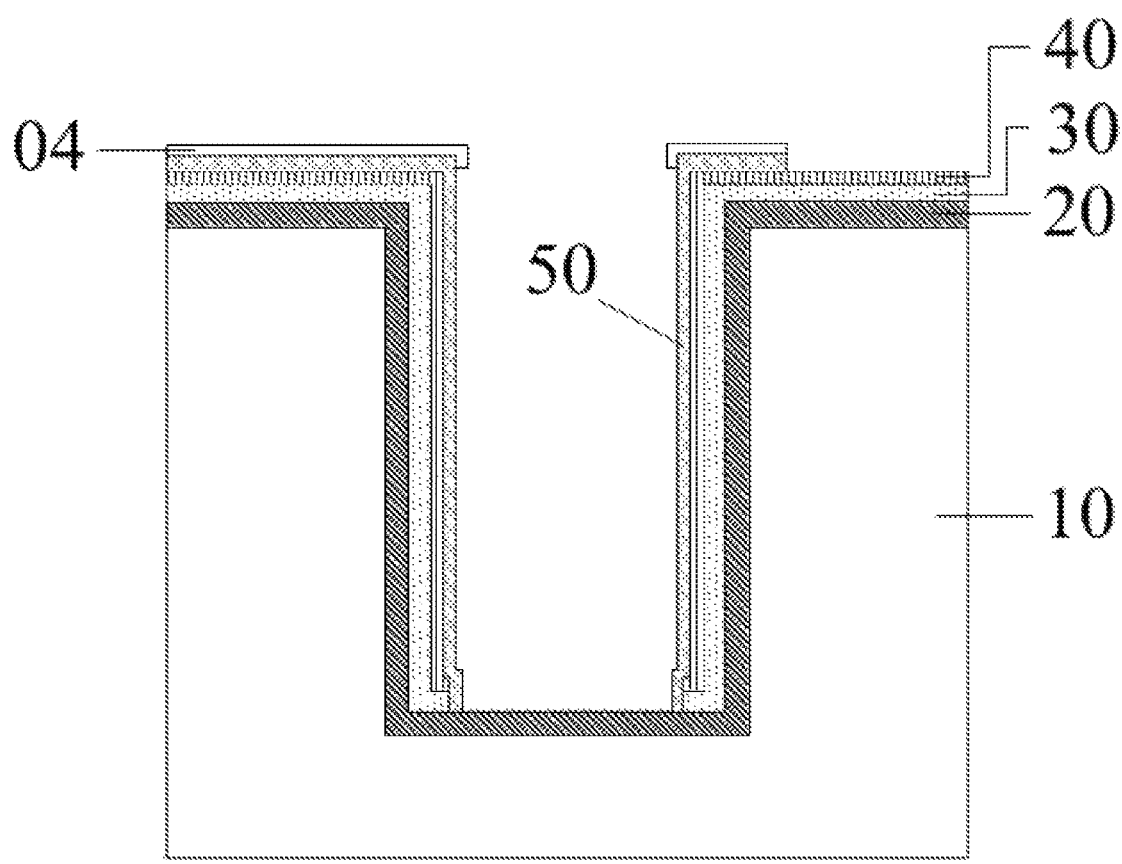
FIG. 7 shows a schematic diagram of the structure formed after removing a part of the second piezoresistive layer at the bottom of the blind-hole by using photoresist.

Referring to FIG. 7, the second piezoresistive layer 50 is shown. The portion of the second piezoresistive layer 50 at the bottom of the blind-hole is connected to the portion of the first piezoresistive layer 30 at the bottom of the blind-hole. It needs to be additionally noted that, the first piezoresistive layer 30 and the second piezoresistive layer 50 may be interconnected at the bottom of the blind-hole and may also be interconnected at the middle part or other locations of the lateral wall of the blind-hole, which is not restricted in the present application. The measured stress is an average stress from the upper surface of the blind-hole to the interconnection location (where the first piezoresistive layer and the second piezoresistive layer are interconnected).

Step S105: providing a first electrode connected to the first piezoresistive layer on the first surface of the substrate and providing a second electrode connected to the second piezoresistive layer on the first surface of the substrate.

Referring to FIG. 8, the first electrode 70, connected to the first piezoresistive layer 30, and the second electrode 80, connected to the second piezoresistive layer 50, are shown.

By means of the above-mentioned manufacturing method of stress sensor, because the first piezoresistive layer and the second piezoresistive layer are manufactured on the inner-wall surface of the blind-hole, instead of being formed by filling an annular deep groove, therefore, the manufacturing method is simple, the formed piezoresistive layers are relatively uniform, and there are no pores between the first piezoresistive layer and the second piezoresistive layer; and as the restrictions on the doping type and concentration of the silicon wafer have been relieved, the axial stress measuring of a TSV structure manufactured with a common silicon wafer can be realized.

Embodiment 3

The embodiments of the present invention provide another manufacturing method of a stress sensor structure, for manufacturing the stress sensor structure described in Embodiment 1. The method comprises the following steps:

Step S201: forming a blind-hole on a first surface of a substrate.

A dry etching process or a wet etching process may be used to etch the substrate to form the blind-hole.

Step S202: forming a first insulating layer on the lateral wall and bottom of the blind-hole.

Figure 1:
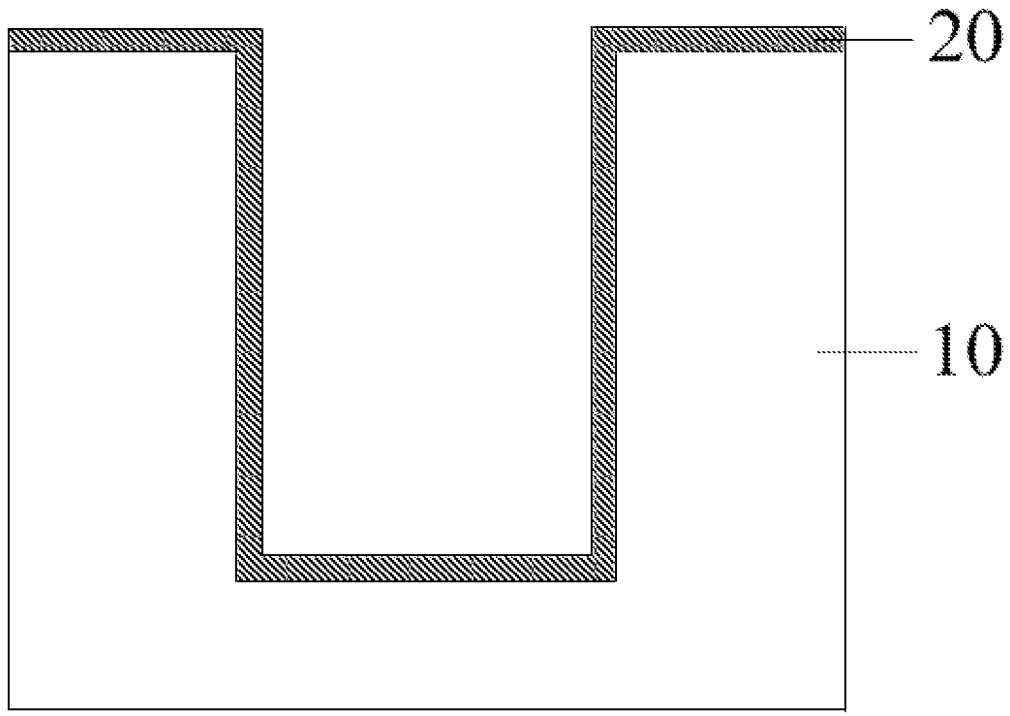
FIG. 1 shows a schematic diagram of forming a blind-hole on a substrate surface.

Referring to FIG. 1, the substrate 10 and the first insulating layer 20 are shown, wherein the blind-hole is provided on the first surface of the substrate 10, and the first insulating layer 20 covers the lateral wall and bottom of the blind-hole. In order to facilitate performing this process step, the first insulating layer 20 may also cover the area surrounding the blind-hole on the first surface of the substrate. The first insulating layer 20 may be silicon oxide or silicon nitride, or may be a layer-stacked structure of silicon oxide and silicon nitride. A thermal oxidation method or a Low Pressure Chemical Vapor Deposition (LPCVD) method may be used to form the first insulating layer 20.

Step S203: forming a first piezoresistive layer on the lateral wall and bottom of the blind-hole. The first piezoresistive layer is formed by material with piezoresistive effect.

Referring to FIG. 2, the first piezoresistive layer 30 is shown. The first piezoresistive layer 30 covers the entire bottom of the blind-hole. In order to facilitate performing this process step, the first piezoresistive layer 30 may also cover the first surface of the blind-hole or the area surrounding the blind-hole on the first insulating layer. An LPCVD method may be used to form the first piezoresistive layer 30.

Step S204: forming a second insulating layer on the lateral wall and bottom of the blind-hole.

Referring to FIG. 3, the second insulating layer 40 is shown. The second insulating layer 40 covers the entire bottom of the blind-hole. In order to facilitate performing this process step, the second insulating layer 40 may also cover the area surrounding the blind-hole on the first surface of the substrate. The second insulating layer 40 may be silicon oxide or silicon nitride, or may be a layer-stacked structure of silicon oxide and silicon nitride. A thermal oxidation method or an LPCVD method may be used to form the second insulating layer 40.

Step S205: removing a first predefined area of the first piezoresistive layer and the second insulating layer at the bottom of the blind-hole, the first predefined area being smaller than or equal to an opening area of the blind-hole.

Figure 5:
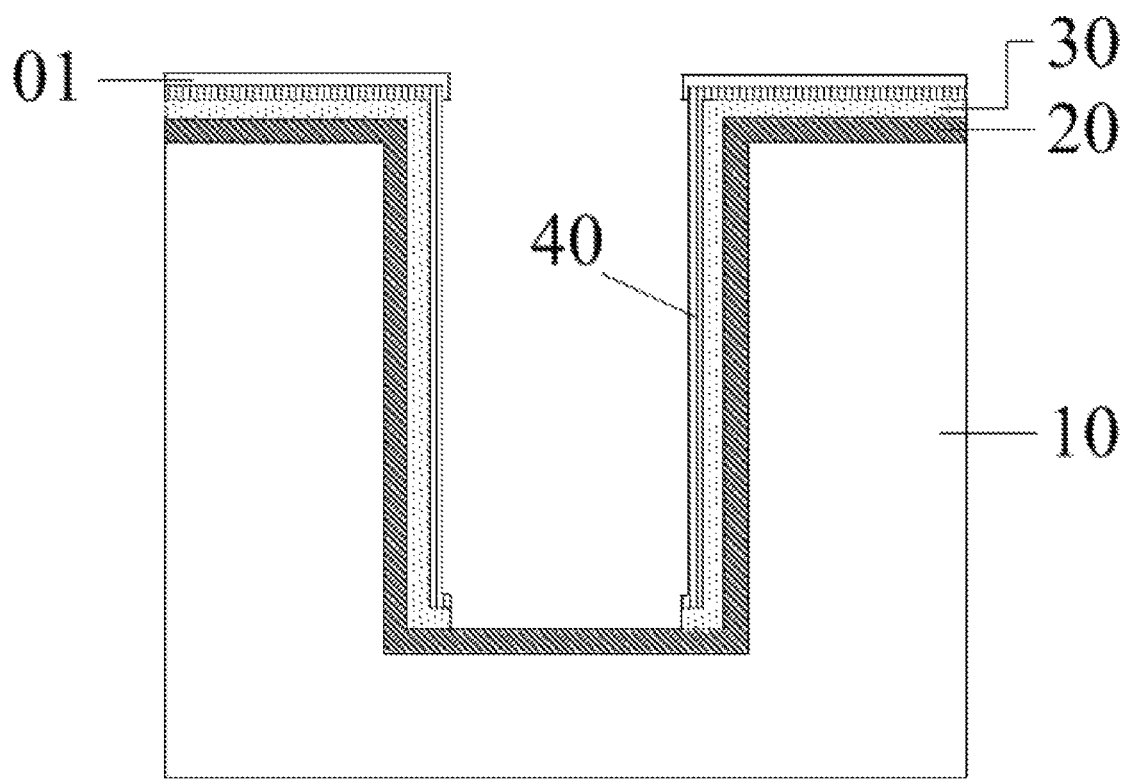
FIG. 5 shows a schematic diagram of the structure formed after removing a part of the first piezoresistive layer and the second insulating layer at the bottom of the blind-hole.
Figure 6:
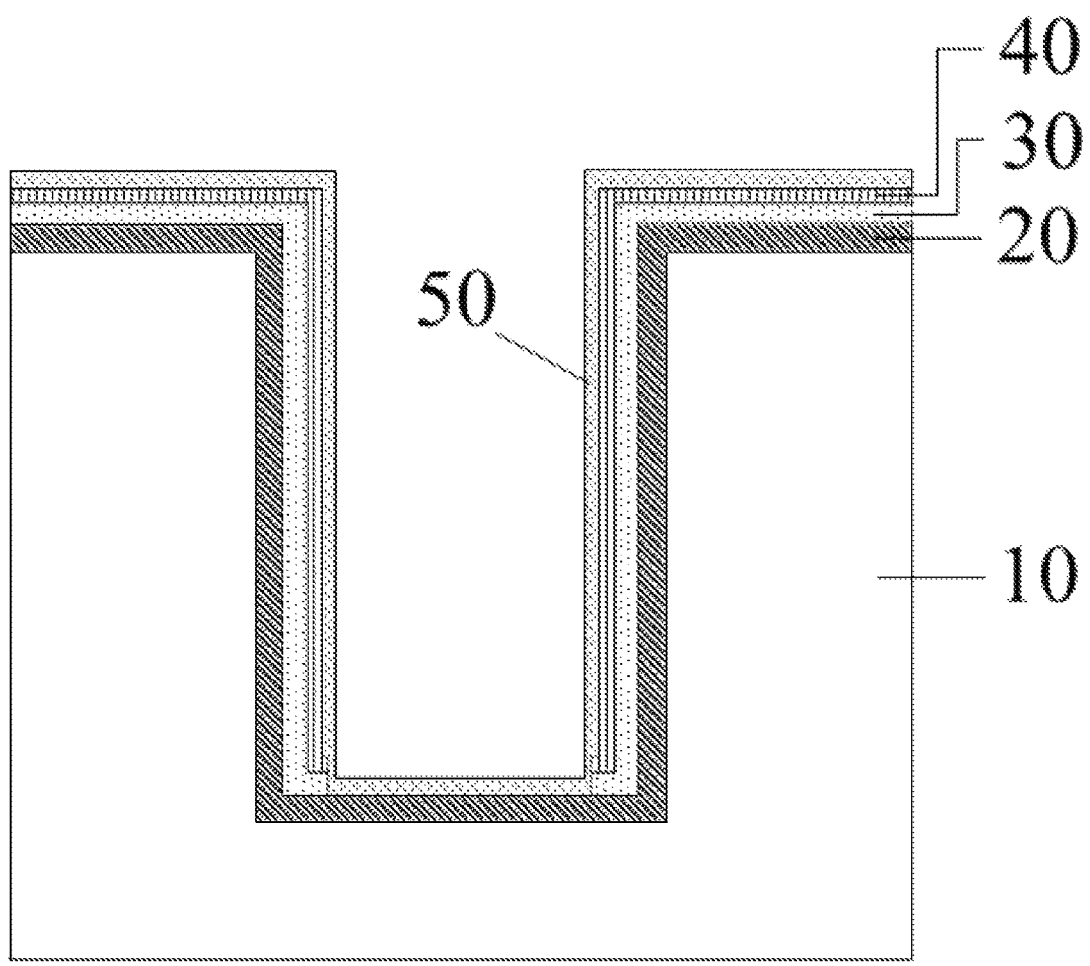
FIG. 6 shows a schematic diagram of forming a second piezoresistive layer on the lateral wall and bottom of the blind-hole

Referring to FIG. 5, the blind-hole structure shown in FIG. 5 is obtained after removing a part of the first piezoresistive layer 30 and the second insulating layer 40 at the bottom of the blind-hole. When the first predefined area is smaller than the opening area of the blind-hole, the first piezoresistive layer 30 and the second insulating layer 40 both protrude towards the center of the blind-hole, and the first piezoresistive layer 30 emerges, as shown in FIG. 5; when the first predefined area is equal to the opening area of the blind-hole, only the lateral wall of the second insulating layer 40 remains, without protruding towards the center of the blind-hole, and the first piezoresistive layer 30 protrude towards the center of the blind-hole and emerges.

Because the depth-to-width ratio of the blind-hole can be 10:1, it is difficult to use an ordinary photo-etching process to realize the Step S205. The method shown in FIG. 4 may be used to remove the part of the first piezoresistive layer 30 and the second insulating layer 40 at the bottom of the blind-hole.

Figure 4:
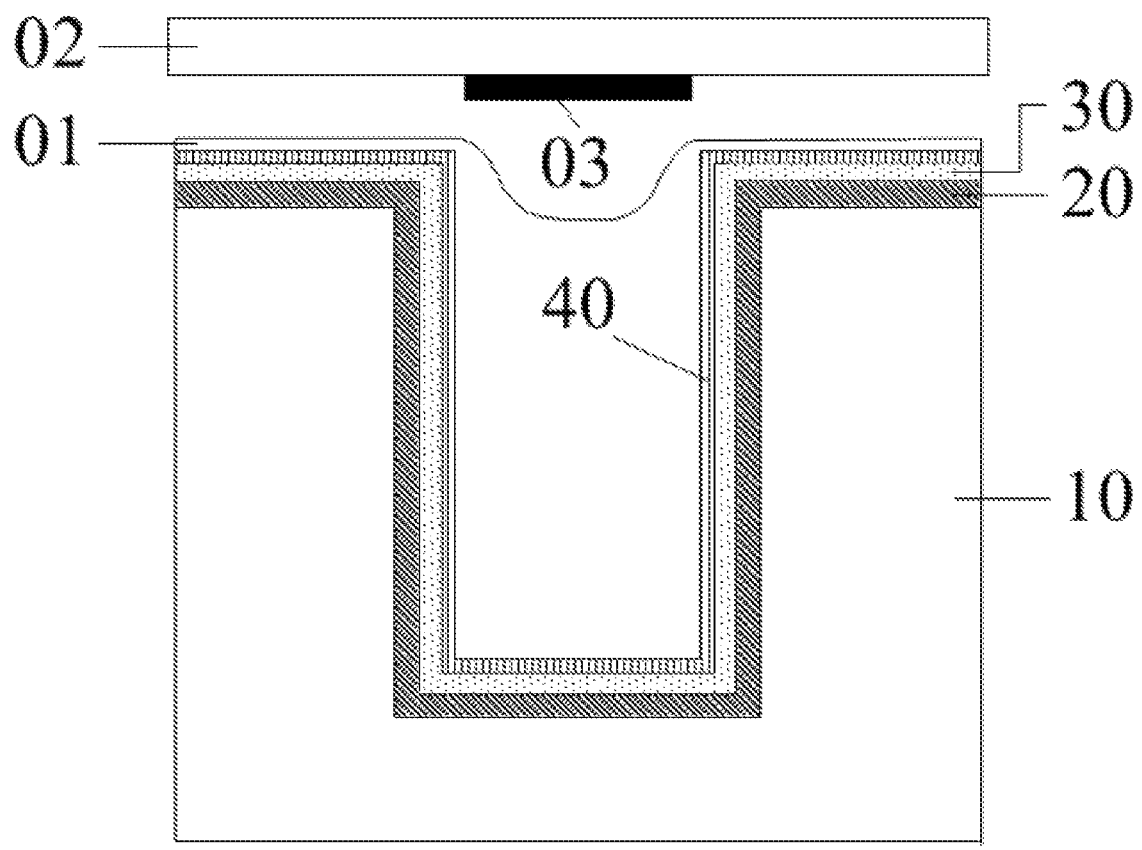
FIG. 4 shows a schematic diagram of removing a part of the first piezoresistive layer and the second insulating layer at the bottom of the blind-hole by using photoresist.

As shown in FIG. 4, photoresist 01 is coated on the first surface of the substrate and in the blind-hole, photo-etching mask 02 has a transparent or non-transparent zone 03 thereon with an area equal to the first predefined area or slightly smaller than the first predefined area (wherein the dimension difference is larger than the photo-etching alignment error). The photoresist corresponding to the zone 03 is removed when exposed to the light, and on such basis, the remaining photoresist is used as a mask layer for etching the bottom of the blind-hole, for example, by using a deep reactive ion etching method or an ion bombardment method. The photoresist 01 may be dry-film photoresist or negative photoresist.

When the photoresist is negative thin photoresist, the negative photoresist solidifies after being exposed to the light, the photoresist in the non-transparent zone is removed when developing, and because of the poor light transmittance of thin mask and the very thick photoresist piled in the blind-hole, only a thin surface layer of photoresist would remain in the transparent zone on the edge of the blind-hole, others thereof would be likewise removed when developing. The problem of size inaccuracy of the bottom part caused by scattering can be avoided by such a method using negative thin photoresist.

Step S206: forming a second piezoresistive layer on the lateral wall and bottom of the blind-hole. The second piezoresistive layer is formed by material with piezoresistive effect.

Referring to FIG. 4, the second piezoresistive layer 50 is shown. The second piezoresistive layer 60 may cover the entire bottom of the blind-hole or may only cover the edge of the bottom of the blind-hole, which is not restricted in the present application. In order to facilitate performing this process step, the second piezoresistive layer 50 may also cover the area surrounding the blind-hole on the first surface of the substrate. An LPCVD method may be used to form the second piezoresistive layer 50.

Because the first piezoresistive layer 30 already emerges at the bottom of the blind-hole after the Step S205, the second piezoresistive layer 50 formed by the Step S206 would necessarily be connected to the first piezoresistive layer 30.

Step S207: removing a second predefined area of the second piezoresistive layer at the bottom of the blind-hole, the second predefined area being smaller than or equal to an opening area of the blind-hole, and the second predefined area being smaller than the first predefined area.

It needs to be emphasized that, the blind-hole opening area in this step is smaller than the blind-hole opening area in the Step S205, therefore the second predefined area is smaller than the first predefined area.

When the second predefined area is smaller than the opening area of the blind-hole, the second piezoresistive layer 50 protrudes towards the center of the blind-hole, as shown in FIG. 7; when the second predefined area is equal to the opening area of the blind-hole, the second piezoresistive layer 50 does not protrude towards the center of the blind-hole.

The method shown in FIG. 4 may be used to remove the part of the second piezoresistive layer 50 at the bottom of the blind-hole, i.e., photoresist 01 is coated on the first surface of the substrate and in the blind-hole, photo-etching mask 02 has a transparent or non-transparent zone 03 thereon with an area equal to the second predefined area or slightly smaller than the second predefined area (wherein the dimension difference is larger than the photo-etching alignment error). The photoresist corresponding to the zone 03 is removed when it is exposed to the light, and on such basis, the remaining photoresist is used as a mask layer for etching the bottom of the blind-hole, for example, by using a deep reactive ion etching method or an ion bombardment method. The photoresist 01 may be dry-film photoresist or negative photoresist.

When the photoresist is negative thin photoresist, the negative photoresist solidifies after being exposed to the light, the photoresist in the non-transparent zone is removed when developing, and because of the poor light transmittance of thin mask and the very thick photoresist piled in the blind-hole, only a thin surface layer of photoresist would remain in the transparent zone on the edge of the blind-hole, while the others would be likewise removed when developing. The problem of photoresist piled in the blind-hole being difficult to be penetrated by ultraviolet light when positive photoresist is exposed to the light can be avoided by such a method using negative thin photoresist.

Removing the part of the second piezoresistive layer at the bottom of the blind-hole can reduce unnecessary piezoresistive layer areas so as to reduce the parasitic capacitance. It needs to be additionally noted that, the manufacturing method provided by the embodiments of the present invention may be implemented without removing the part of the second piezoresistive layer at the bottom of the blind-hole.

Step S208: forming a third insulating layer is provided on a surface of the second piezoresistive layer.

Referring to FIG. 8, the third insulating layer 60 is shown. Because the second piezoresistive layer 50 only remains on the lateral wall of the blind-hole prior to the Step S208, the third insulating layer formed by the Step S208 is also only on the lateral wall of the blind-hole. In particular, the third insulating layer may be first formed on the lateral wall and bottom of the blind-hole, and then the insulating layer part at the bottom of the blind-hole may be removed. The third insulating layer 60 may be silicon oxide or low stress silicon nitride, or may be a layer-stacked structure of silicon oxide and silicon nitride. A thermal oxidation method or an LPCVD method may be used to form the third insulating layer 60.

Because there is the first insulating layer on the bottom of the blind-hole prior to the Step S208, the third insulating layer may not cover the bottom of the blind-hole. Or, as a variant of the Step S208, in order to facilitate performing this process step, the third insulating layer may be formed on both the lateral wall and the bottom of the blind-hole.

Step S209: providing a first electrode connected to the first piezoresistive layer on the first surface of the substrate and providing a second electrode connected to the second piezoresistive layer on the first surface of the substrate.

Referring to FIG. 8, the first electrode 70, connected to the first piezoresistive layer 30, and the second electrode 80, connected to the second piezoresistive layer 50, are shown.

The method of forming the first electrode and the second electrode may be first forming contact windows on the substrate surface by photo-etching or corrosion, and then forming the first electrode and the second electrode at the locations of the contact windows by aluminum sputtering or wet etching.

Figure 9:
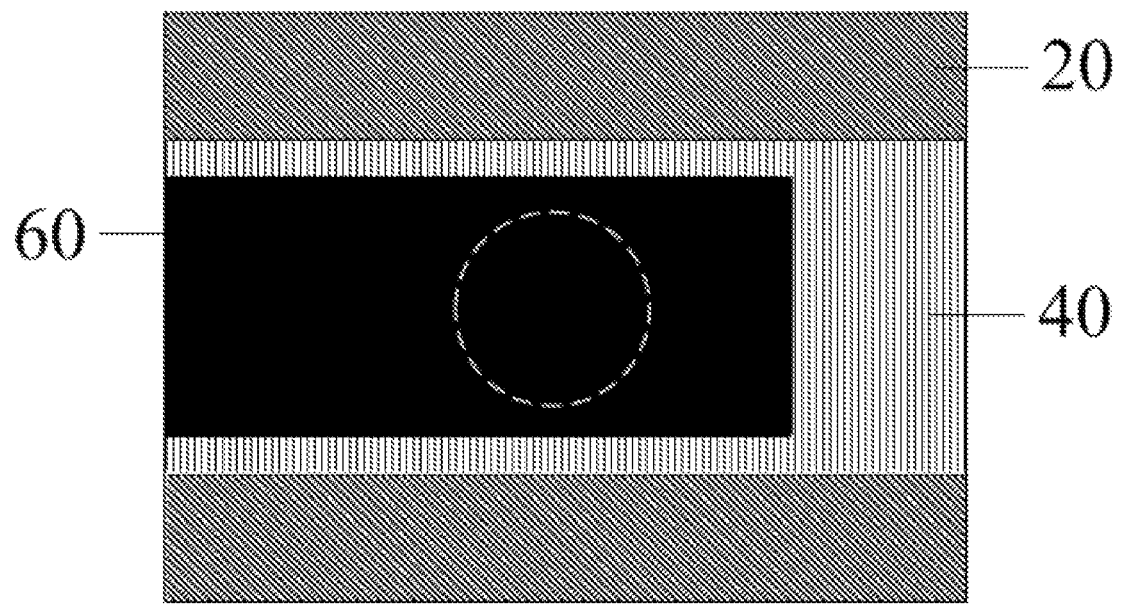
FIG. 9 shows a schematic diagram of the first insulating layer, the second insulating layer and the third insulating layer on the first surface of the substrate.
Figure 10:
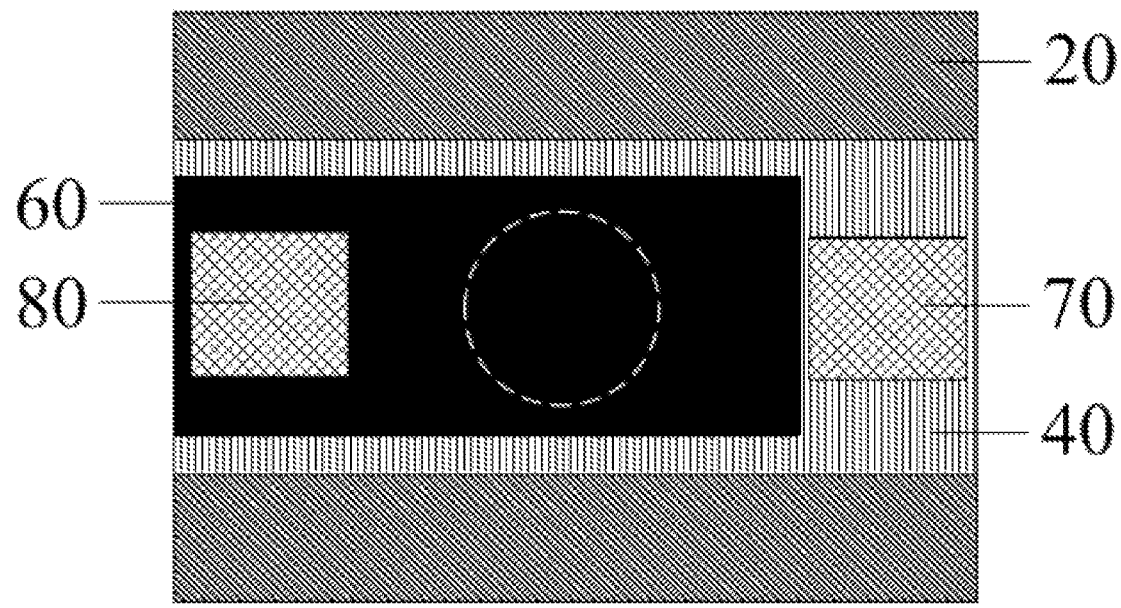
FIG. 10 shows a schematic diagram of positions of the first electrode and the second electrode on the first surface of the substrate.

FIG. 9 shows a schematic diagram of the first insulating layer 20, the second insulating layer 40 and the third insulating layer 60 on the first surface of the substrate, wherein the phantom line circle is the blind-hole opening, It needs to be pointed out that, the respective insulating layers may have various shapes; the sizes and covering relationships of the respective layers may be other different situations, and what is needed is only that the first insulating layer 20 insulates the substrate 10 from the first piezoresistive layer 30, the second insulating layer 40 insulates the first piezoresistive layer 30 from the second piezoresistive layer 50, and the third insulating layer 60 insulates the second piezoresistive layer 50 from the electrical-conductive metal filled in the blind-hole. FIG. 9 only shows one shape design and one covering relationship of the respective insulating layers, i.e., the third insulating layer 60 covers upon the second insulating layer 40, and the second insulating layer 40 covers upon the first insulating layer 20. FIG. 10 shows a schematic diagram of positions of the first electrode and the second electrode on the first surface of the substrate.

Step S210: filling electrical-conductive metal into the blind-hole.

Figure 11:
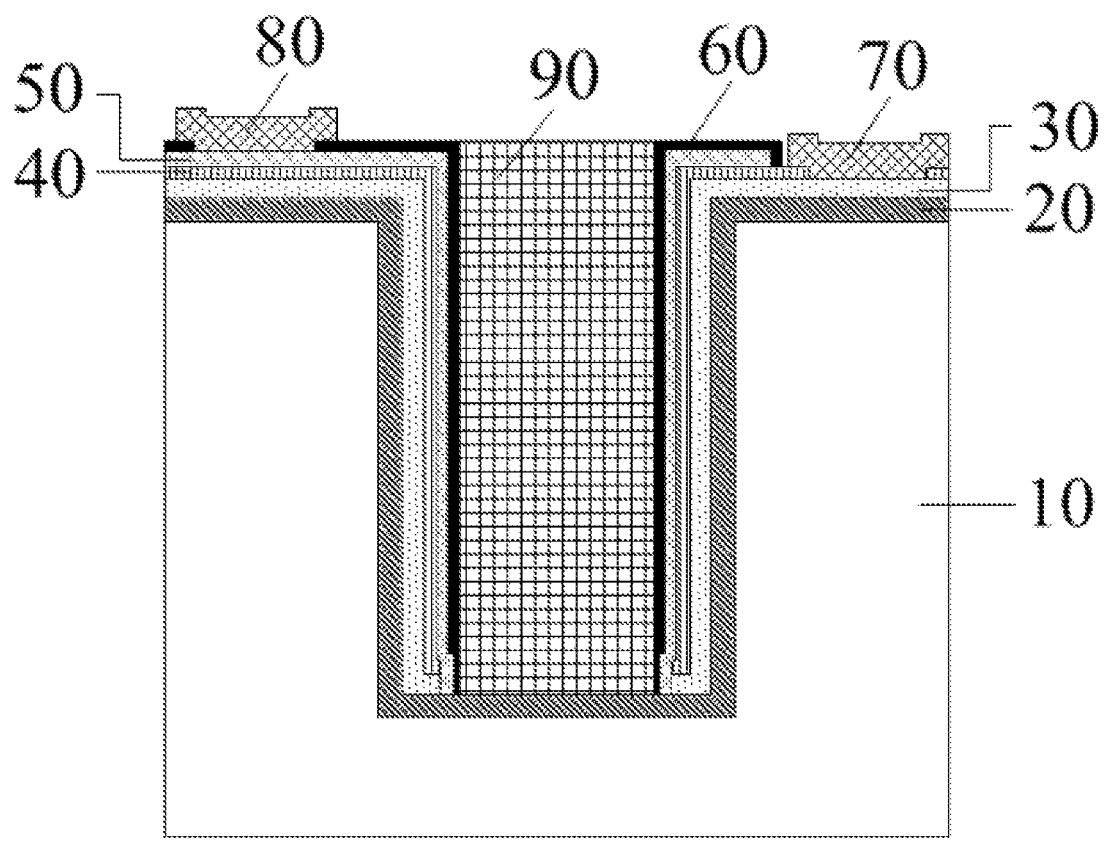
FIG. 11 shows a schematic diagram of filling electrical-conductive metal into the blind-hole.

Referring to FIG. 11, the electrical-conductive metal 90 is shown. The electrical-conductive metal may be copper.

Step S211: thinning the second surface of the substrate until the first piezoresistive layer or the filled electrical-conductive metal emerges. The second surface is disposed opposite to the first surface.

Figure 12:
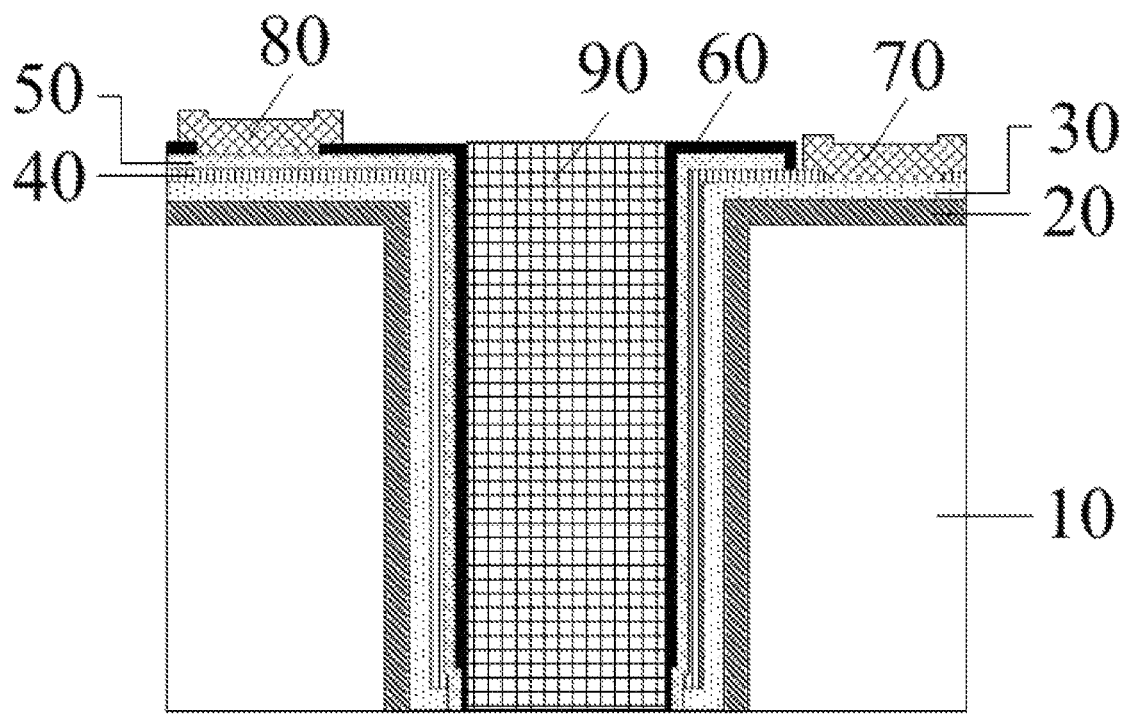
FIG. 12 shows a schematic diagram after thinning the second surface of the substrate.

As shown in FIG. 12, after the second surface is thinned, the blind-hole becomes a through-hole passing through the first surface and the second surface, wherein, the bottom of the first insulating layer 20 has been removed, and the first piezoresistive layer 30 or the filled electrical-conductive metal emerges, thereby forming a TSV through-hole structure.

Although the embodiments and their advantages have been described in detail, a person skilled in the art can make various changes, substitutions and modifications to these embodiments without departing from the spirit of the present invention and the protection scope defined by the appended claims, and such modifications and variants all fall into the scope defined by the appended claims. As for the other examples, an ordinary person skilled in the art should easily understand that the sequence of the process steps can be changed while being kept within the protection scope of the present invention.

Furthermore, the application scope of the present invention is not limited to the processes, mechanisms, manufacture, substance compositions, means, methods and steps of the specific embodiments described in the specification. From the disclosure of the present invention, an ordinary person skilled in the art would easily understand that, the already existing or later developed processes, mechanisms, manufacture, substance compositions, means, methods and steps which perform roughly the same functions or achieve roughly the same results as the corresponding embodiments described in the present invention can be applied according to the present invention. Therefore, the claims appended to the present invention are intended to include these processes, mechanisms, manufacture, substance compositions, means, methods and steps within the protection scope thereof.

The invention claimed is:

1. A stress sensor structure comprising:
    a substrate;
    a blind-hole, provided on a surface of the substrate;
    a first piezoresistive layer and a second piezoresistive layer, each formed by a material with piezoresistive effect, and provided on a lateral wall of the blind-hole and interconnected at bottom portions of the first piezoresistive layer and the second piezoresistive layer;
    an insulating layer, provided between the first piezoresistive layer and the second piezoresistive layer;
    a first electrode, provided on the surface of the substrate and connected to the first piezoresistive layer;
    a second electrode, provided on the surface of the substrate and connected to the second piezoresistive layer.

2. The stress sensor structure according to claim 1, wherein the insulating layer is a second insulating layer, the stress sensor structure further comprising a first insulating layer between the first piezoresistive layer and the substrate.

3. The stress sensor structure according to claim 1, further comprising a third insulating layer provided on one side of the second piezoresistive layer facing the blind-hole.

4. The stress sensor structure according to claim 3, wherein the blind-hole is filled with electrical-conductive metal.

5. A method of manufacturing a stress sensor structure comprising:
   forming a blind-hole on a surface of a substrate;
   forming a first piezoresistive layer on a lateral wall of the blind-hole;
   forming an insulating layer on a surface of the first piezoresistive layer, wherein a bottom portion of the insulating layer is higher than a bottom portion of the first piezoresistive layer;
   forming a second piezoresistive layer on the lateral wall of the blind-hole, the second piezoresistive layer being connected to a bottom portion of the first piezoresistive layer;
   providing a first electrode connected to the first piezoresistive layer on the surface of the substrate; and
   providing a second electrode connected to the second piezoresistive layer on the surface of the substrate.

6. The method according to claim 5, wherein the forming the first piezoresistive layer and the forming the insulating layer comprises:
   forming the first piezoresistive layer on the lateral wall and bottom of the blind-hole;
   forming the insulating layer on the lateral wall and bottom of the blind-hole; and
   removing a first predefined area of the first piezoresistive layer and the insulating layer at the bottom of the blind-hole, the first predefined area being smaller than or equal to an opening area of the blind-hole.

7. The method according to claim 5, wherein the forming the second piezoresistive layer comprises:
   forming the second piezoresistive layer on the lateral wall and bottom of the blind-hole; and
   removing a second predefined area of the second piezoresistive layer at the bottom of the blind-hole, the second predefined area being smaller than or equal to an opening area of the blind-hole, and the second predefined area being smaller than a first predefined area.

8. The manufacturing method according to claim 5, wherein the insulating layer is a second insulating layer, the method further comprising forming a first insulating layer on the lateral wall and bottom of the blind-hole after the forming the blind-hole and before the forming the first piezoresistive layer.

9. The manufacturing method according to claim 8, further comprising forming a third insulating layer on a surface of the second piezoresistive layer after the forming the second piezoresistive layer.

10. The manufacturing method according to claim 9, further comprising filling electrical-conductive metal into the blind-hole after the forming the third insulating layer.

* * * * *